| United States Patent [19] | [11] Patent Number: 4,888,560 |
|---|---|
| Ogura | [45] Date of Patent: Dec. 19, 1989 |

[54] GAIN-VARIABLE AMPLIFIER CIRCUIT

[75] Inventor: Yoichi Ogura, Hino, Japan

[73] Assignee: Kabushiki Kaisha Toshiba, Kawasaki, Japan

[21] Appl. No.: 219,370

[22] Filed: Jul. 15, 1988

[30] Foreign Application Priority Data

Jul. 16, 1987 [JP] Japan .................... 62-177410

[51] Int. Cl.$^4$ .............................................. H03F 3/18
[52] U.S. Cl. ..................................... 330/254; 330/284
[58] Field of Search ............... 330/252, 254, 261, 278, 330/279, 284, 285, 295, 302, 304

[56] References Cited

U.S. PATENT DOCUMENTS 4,219,788  8/1980  Cordell ..................... 330/284 X
4,262,263  4/1981  Takasaki ..................... 330/304
4,528,515  7/1985  Gross ........................ 330/254

FOREIGN PATENT DOCUMENTS 3002995  8/1980  Fed. Rep. of Germany .

Primary Examiner—Steven Mottola
Attorney, Agent, or Firm—Oblon, Spivak, McClelland, Maier & Neustadt

[57] ABSTRACT

A variable gain amplifier for compensating for an amplitude frequency response characteristic of an input signal transmitted through a transmission path having a predetermined attenuation characteristic, includes a first amplifier for amplifying the input signal with a substantially flat amplitude frequency response characteristic, a second amplifier for amplifying the input signal with a predetermined amplitude frequency response characteristic corresponding to the attenuation characteristic of the transmission path, an adder circuit for reciprocally level-controlling the signals amplified by the first and second amplifiers so that a level of one of the signals is increased when a level of the other signal is reduced, and adding the level-controlled signals to each other, and an addition controller for variably setting a determination amount of level control performed by the adder circuit in accordance with a line length of the transmission path.

13 Claims, 9 Drawing Sheets

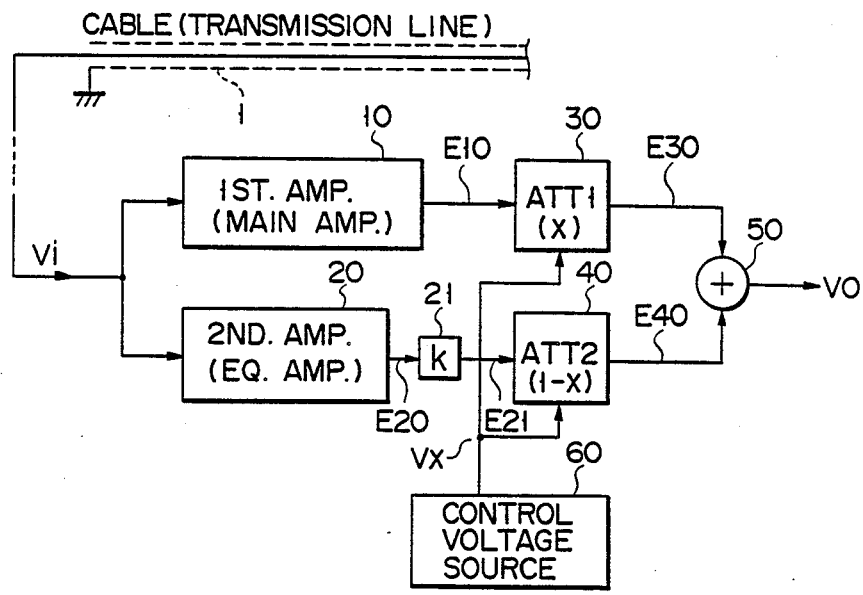
F I G. 1
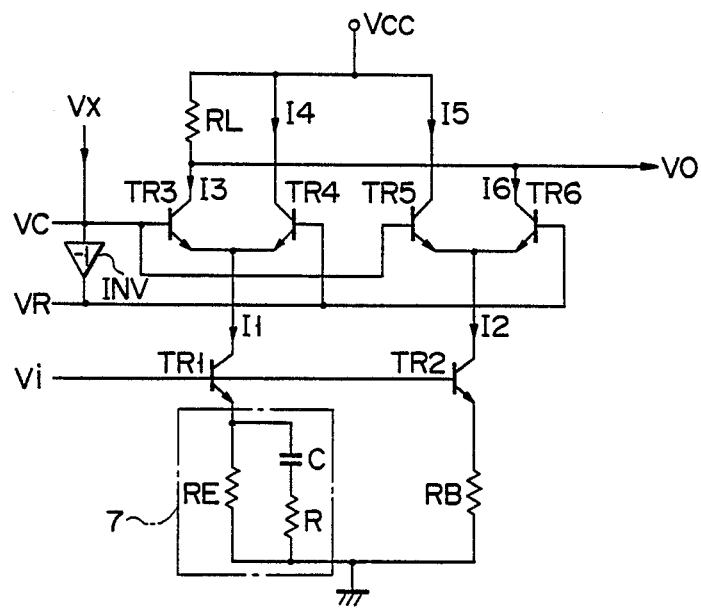
F I G. 2

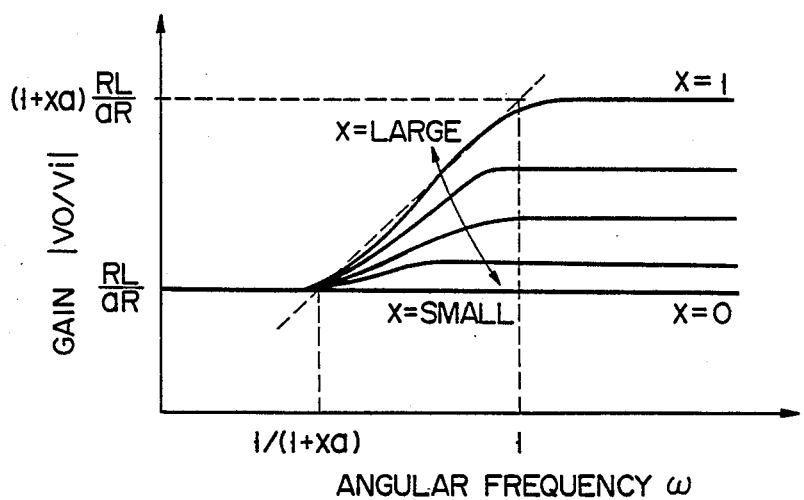
F I G. 4
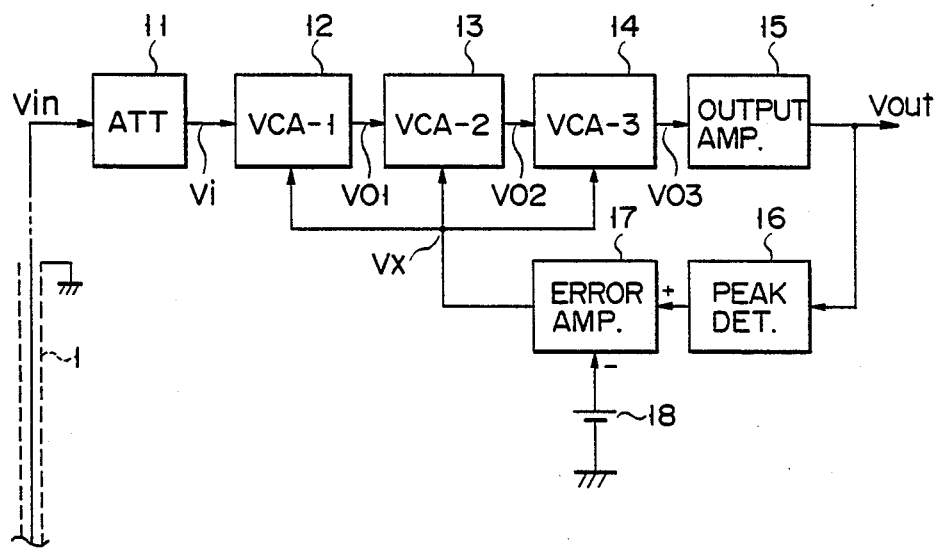
F I G. 5

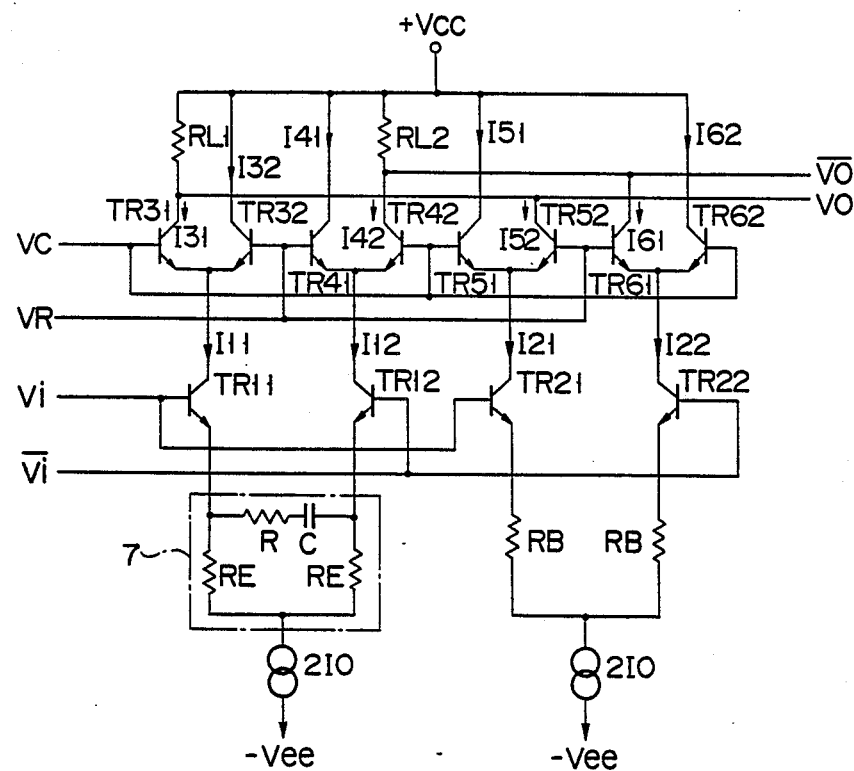
F I G. 7
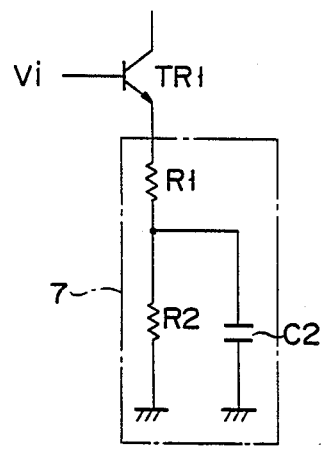
F I G. 8

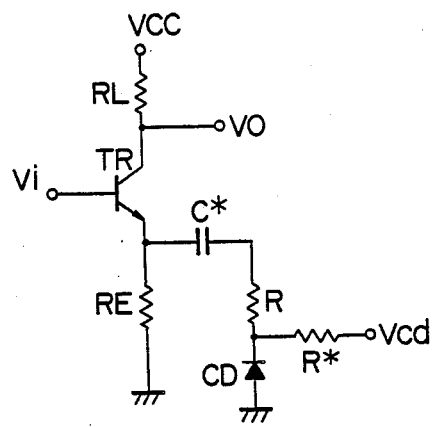
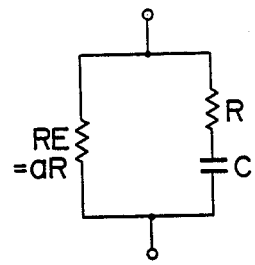
F I G. 11
(PRIOR ART)
F I G. 12
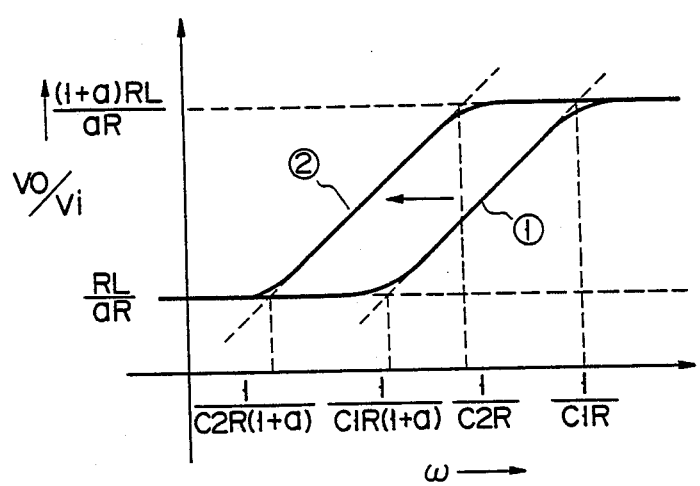
F I G. 13

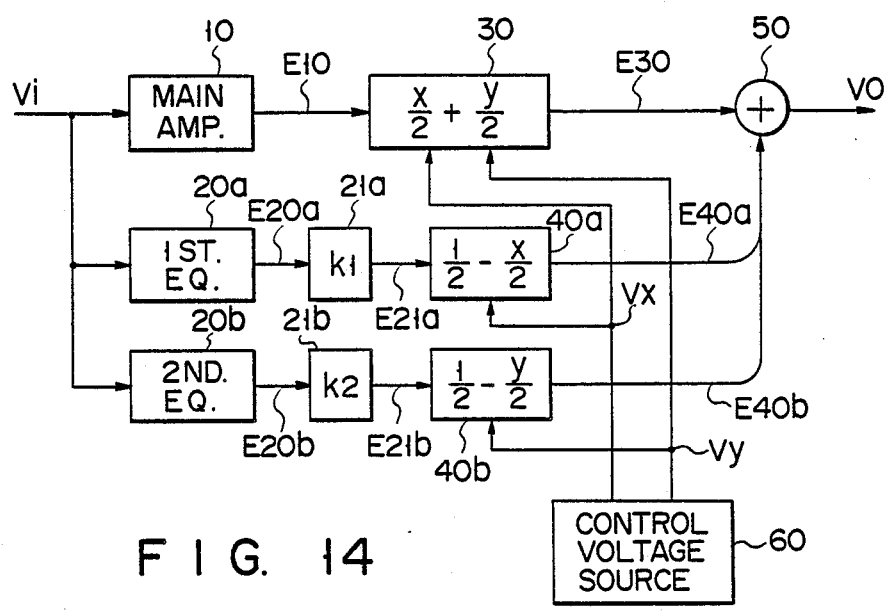
F I G. 14
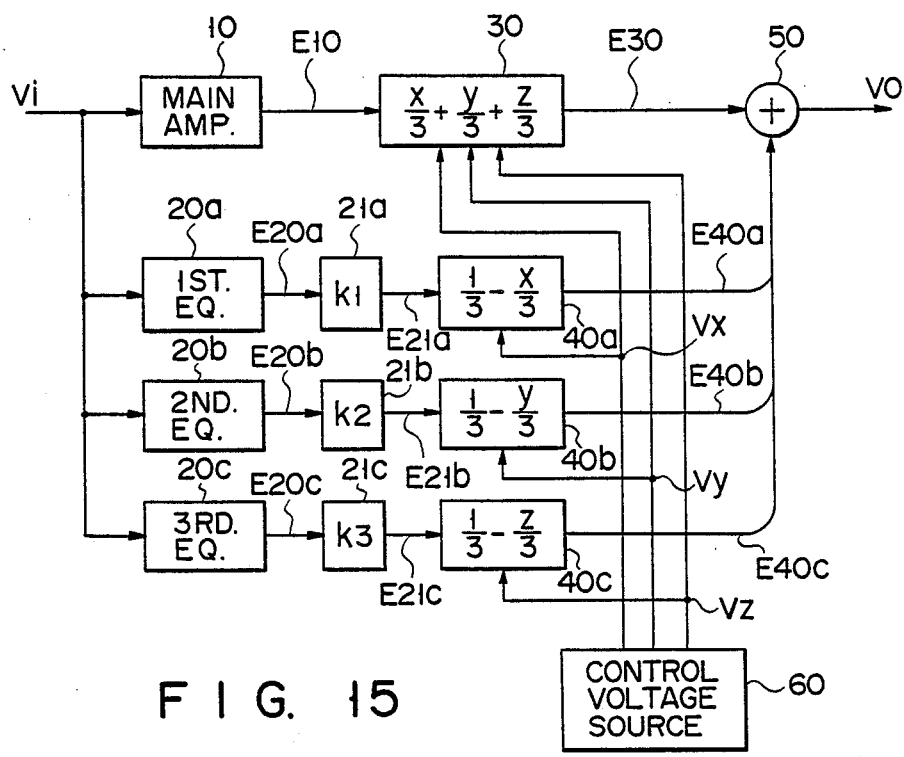
F I G. 15

GAIN-VARIABLE AMPLIFIER CIRCUIT

BACKGROUND OF THE INVENTION

1. Field of the Invention

The present invention relates to a variable gain amplifier for performing waveform equalization of a signal attenuated by a transmission path, at a relay terminal and/or a reception terminal of a communication network.

2. Description of the Related Art

Recently, a large number of LANs (Local Area Networks) have been constructed to cope with increased communication demands. In a LAN, a coaxial cable or an optical fiber is generally used as a transmission path. Of the two types of transmission paths, due to a skin effect, the attenuation in the coaxial cable is increased as the frequency is increased. Since the attenuation amount is increased in proportion to a ½ square of the frequency, this is called a $\sqrt{f}$ characteristic.

FIG. 10 shows the $\sqrt{f}$ characteristic of a 3C-2T (or 3C-2V) type coaxial cable. The attenuation amount L (dB) is represented as follows, assuming that a frequency is f (MHz) and a cable length is l (km):

$$L \simeq 12.7\sqrt{fl} \ [dB] \quad (1)$$

When the coaxial cable is used as a transmission path, a signal passing through the path is subjected to attenuation of an amplitude as well as a waveform distortion. Therefore, at a receiving side, a variable gain amplifier is provided, which has an amplification characteristic for compensating for the $\sqrt{f}$ characteristic and which performs feedback control in accordance with a change in cable length so that the signal level installed is maintained as a constant, and performs waveform equalization of a reception signal.

FIG. 11 shows an arrangement of a conventional variable gain amplifier of this type. This amplifier includes varactor diode CD whose capacitance is externally controlled by variable control voltage Vcd, thereby compensating for the amplitude-frequency characteristic of reception signal input Vi.

In this case, an emitter circuit of transistor TR is equivalently represented as shown in FIG. 12, and its impedance Z(f) is represented by the following equation, assuming that an emitter resistance is RE=aR, and that the equivalent capacitance of the series-connected C* and Cd is C, where Cd denotes the capacitance of diode CD:

$$Z(f) = \frac{1 + j\omega CR}{1 + j\omega CR(1 + a)} \quad (2)$$

AC output vo of the above variable gain amplifier is represented as follows in accordance with equation (2)

$$vo = \frac{1 + j\omega CR(1 + a)}{aR(1 + j\omega CR)} RL \cdot vi \quad (3)$$

FIG. 13 shows an amplitude frequency response characteristic of amplification degree vo/vi obtained from equation (3). As is apparent from FIG. 13, the amount ((1+a)RL/aR) of increase in gain, the pole (1/CR), and the zero point (1/CR(1+a)) in a high-frequency range can all be set to be prescribed values by suitably selecting a and R. In practice, a proper number of variable gain amplifiers are cascade connected, so that the accuracy of the $\sqrt{f}$ increasing characteristic in the total amplitude frequency response characteristic is improved.

Assuming that the cable length is changed from $l_1$ to $l_2$, attenuation amount L is given as follows in accordance with equation (1):

$$L = 12.7 l_2 \sqrt{f} = 12.7 l_1 \sqrt{(l_2/l_1)^2 f} \quad (4)$$

As is apparent from equation (4), changing the cable length by $\Delta l$ (=$l_2 - l_1$) is equivalent to changing the frequency from f to $f(l_2/l_1)^2$. Therefore, by changing C in FIG. 13, the frequency response curve can be slid from ① to ②, so that the compensation characteristic can follow the change in the actual cable length. In this case, the relationship between the changes in c and l is represented by the following equation:

$$c_2/c_1 = (l_2/l_1)^2 \quad (5)$$

However, since the capacitance of the varactor diode changes up to a maximum of ten times, the change in cable length which can be compensated for by the varactor diode is limited to about three times ($\sqrt{10}$ times). For this reason, assuming that the maximum cable length is lmax, the range of ⅓lmax to lmax can be compensated, and the range below ⅓lmax cannot be compensated. Therefore, in order to perform automatic equalization throughout the entire cable length, a pseudo line (e.g., an LCR network) of ⅔lmax or more must be provided before the variable gain amplifier and has to be automatically inserted/removed in accordance with the cable length. In this case, however, the size of a circuit is enlarged and the frequency-response compensation control is complicated. Consequently, it is difficult to realize the whole circuitry in an IC arrangement, resulting in a serious disadvantage.

As described above, according to the circuit of FIG. 11, characteristic compensation is performed using a varactor diode. Since a variable range of a capacitance of the varactor diode is not enough, the range of a cable length, within which the $\sqrt{f}$ characteristic can be compensated for, is limited. Therefore, in order to achieve an automatically compensation for a short cable, a pseudo line must be provided to be automatically inserted/removed. As a result, the size of a circuit is increased, control is complicated, and an IC arrangement of the whole circuitry is difficult to realize.

SUMMARY OF THE INVENTION

It is accordingly an object of the present invention to provide a variable gain amplifier which can compensate for the entire length of a transmission path without using a pseudo line, thus allowing compact and simple control and providing an easy circuit integration.

To achieve the above object, there is provided a first amplifier having a flat amplitude-frequency characteristic, which does not always depend on the characteristic of a transmission path, and a second amplifier having a predetermined amplitude frequency response characteristic corresponding to the attenuation characteristic of a transmission path. Signals transmitted through the transmission path are supplied to the amplifiers to be amplified. An adder is provided after the first and second amplifiers. In the adder, the signals amplified by the first and second amplifiers are reciprocally level-controlled and then added to each other. (In the reciprocal level control, when one input level is increased, the other input level is decreased, and vice versa.) The level of the reciprocal control performed by the adder can be variably set in accordance with the line length of the transmission path.

As a result, a signal amplified by the first amplifier, and a signal amplified by the second amplifier having an amplitude frequency response characteristic corresponding to the attenuation characteristic of a transmission path, are reciprocally level-controlled at a ratio corresponding to the line length and line characteristic of the transmission path, and are added to each other in the adder to provide an output signal. Then, the attenuation characteristic of a transmitted signal can be actually compensated for throughout the entire length of the transmission path. Thus, no pseudo line is required to be inserted/detached as in a conventional circuit using a varactor diode, and the size of the circuit is thereby made compact, control is simplified, and an IC arrangement is easily realized.

BRIEF DESCRIPTION OF THE DRAWINGS

FIG. 1 is a block diagram showing a first basic arrangement of a variable gain amplifier according to the present invention wherein one gain control voltage Vx is used;

FIG. 2 is a circuit diagram showing an unbalanced type amplifier according to the arrangement in FIG. 1 wherein network circuit 7 is constituted by a CR;

FIG. 4 is a graph showing a frequency response characteristic of the circuit in FIG. 2;

FIG. 5 is a block diagram showing an automatic gain-variable amplifier obtained by cascade-connecting three variable gain amplifiers having the arrangement in FIG. 1;

FIG. 7 is a circuit diagram showing a balanced type amplifier according to the arrangement in FIG. 1 wherein network circuit 7 is constituted by a CR;

FIG. 8 is a circuit diagram showing a modification of network circuit 7 in FIG. 2;

FIG. 11 is a circuit diagram showing a conventional variable gain amplifier;

FIG. 12 is an equivalent circuit diagram of a network circuit used in FIG. 11;

FIG. 13 is a graph showing a frequency response characteristic of the circuit in FIG. 11;

FIG. 14 is a block diagram showing a second basic arrangement of a variable gain amplifier according to the present invention wherein two gain control voltages Vx and Vy are used;

FIG. 15 is a block diagram showing a third basic arrangement of a variable gain amplifier according to the present invention wherein three gain control voltages Vx, Vy, and Vz are used;

DETAILED DESCRIPTION OF THE PREFERRED EMBODIMENTS

Figure 3:
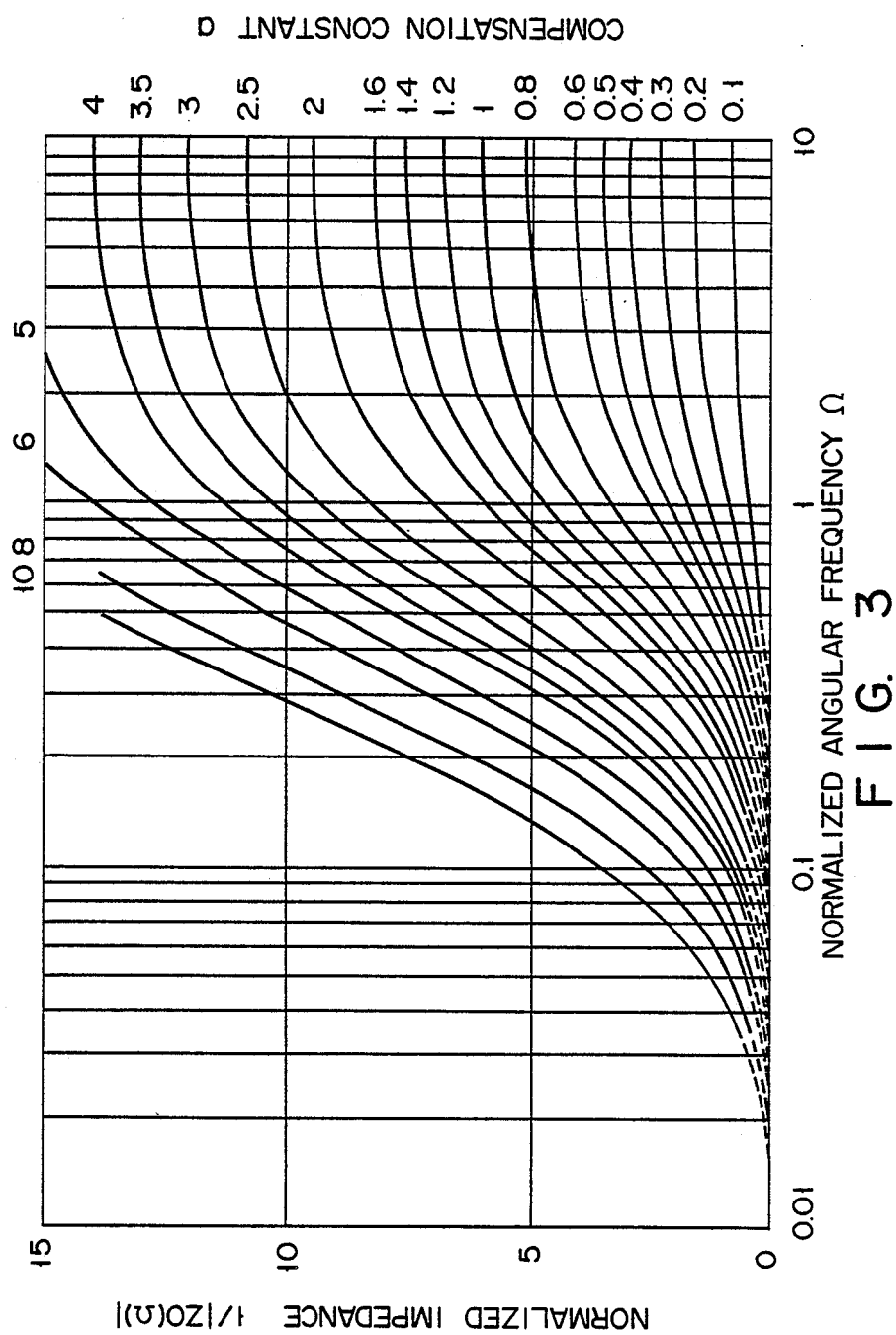
FIG. 3 is a graph showing a normalized impedance characteristic of the circuit in FIG. 2.

FIG. 1 is a block diagram of a variable gain amplifier according to an embodiment of the present invention. This amplifier is applied to coaxial cable 1 and comprises first amplifier (main amplifier) 10 having a flat amplitude frequency response characteristic; second amplifier (equalizer amplifier) 20 having an amplitude frequency response characteristic obtained by approximating the $\sqrt{f}$ characteristic; externally voltage-controlled variable attenuators (ATT1 and ATT2) 30 and 40 provided after amplifiers 10 and 20, respectively; coefficient unit 21 optionally inserted between amplifier 20 and attenuator 40; adder 50 for adding outputs from attenuators 30 and 40; and control voltage source 60 for providing control voltage Vx to attenuators 30 and 40. Attenuators 30 and 40 are arranged such that their attenuation amounts change in opposite directions, i.e., reciprocally change like a seesaw. More specifically, the level of output E10 from amplifier 10 and that of signal E21, obtained by modifying output E20 from amplifier 20 by coefficient k of coefficient unit 21, are controlled to be based on control voltage Vx. Controller 6 generates an attenuation amount set signal (i.e., control voltage Vx) corresponding to the length of coaxial cable 1 used as a transmission path, and then supplies signal Vx to attenuators 30 and 40.

Incidentally, control voltage Vx can be replaced with a corresponding current signal. In addition, although coefficient k of coefficient unit 21 is conventionally set at "1", coefficient k other than "1" can be selected. The ratio of the output from ATT1 to that from ATT2 can be optionally changed in accordance with coefficient k having a value other than "1". Further, a main amplifier having variable gain "x", which corresponds to a combination of amplifier 10 and attenuator ATT1, ca be used in combination with an equalizer amplifier having variable gain "(1−x)", which corresponds to a combination of amplifier 20 and attenuator ATT2, so that the both outputs from the main and equalizer amplifiers are mixed at adder 50.

FIG. 2 is a circuit diagram showing an embodiment of the above variable gain amplifier constituted by discrete circuit parts. This circuit includes transistors TR1 and TR2 for receiving reception signal voltage input Vi and converting it into current I1. Network circuit 7 and resistor RB are connected to the emitters of transistors T1R and TR2, respectively.

Circuit 7 gives the $\sqrt{f}$ frequency response characteristic of coaxial cable 1 to signal current I1 flowing through transistor TR1. In circuit 7, emitter resistor RE and a series circuit of capacitor C and resistor R are parallel connected.

Differential circuits comprising a pair of transistors TR3 and TR4 and a pair of transistors TR5 and TR6 are connected to the collectors of transistors TR1 and TR2, respectively. Attenuation amount set signal Vx supplied from control circuit 60 is applied as voltage VC to the base of each of transistors TR3 and TR5. Meanwhile, signal Vx is converted into phase-inverted voltage VR, via inverter INV, and voltage VR is applied to the base of each of transistors TR4 and TR6. In response to these complementary voltages VC and VR, signal currents I1 and I2 flow into transistors TR3 and TR4 and transistors TR5 and TR6 at a ratio of x : (1−x). Voltages corresponding to the sum of signal currents I3 and I6 flowing through transistors TR3 and TR6 are added at load resistor RL, and output as compensated reception signal voltage V0.

With the above arrangement, impedance Z(f) of network circuit 7 is represented as follows, assuming that emitter resistor RE =aR:

$$Z(f) = aR \frac{1 + j\omega CR}{1 + j\omega CR(1 + a)} \quad (11)$$

For this reason, collector current I1 of transistor TR1 is given as follows:

$$I1 = \frac{Vi}{Z(f)} = \frac{1 + j\omega CR(1 + a)}{aR(1 + j\omega CR)} Vi \quad (12)$$

If Z(f) is normalized by Z(0) and $\Omega = \omega CR$ is substituted in equation (12), the following equation is obtained:

$$Z_0(\Omega) = \frac{Z(\Omega)}{Z(0)} = \frac{1 + j\Omega}{1 + j\Omega(1 + a)} \quad (13)$$

FIG. 3 shows a reciprocal of equation (13) using a as a parameter. A gain in a high-frequency range ($\Omega \geq 0.1$) can be boosted by suitably selecting the value of a. The characteristic of FIG. 3 has the same curve as that obtained by equation (13), and the $\sqrt{f}$ characteristic can be compensated by cascade-connecting one or more of the circuits of FIG. 2 in which a is suitably set.

Reception signal current I1 flowing through transistor TR1 is given by the $\sqrt{f}$ response-boosted characteristic of network circuit 7. Reception signal current I1 flowing through transistor TR1 is divided at a ratio of x:(1−x) by transistors TR3 and TR4 in accordance with complementary voltages VC and VR of attenuation set signal Vx. Thus, xI1 flows through the collector of transistor TR3 (I3=xI1), and (1−x)I1 flows through the collector of transistor TR4 (I4=(1−x)I1).

Meanwhile, reception signal current I2, which is subjected to a voltage/current conversion by transistor TR2, is given a flat amplitude-frequency characteristic by resistor RB and is divided at a ratio of x:(1−x) by transistors TR5 and TR6. The collector current of (1−x)I2 then flows through transistor TR6. A voltage value corresponding to collector current I6 of transistor TR6 is added to a voltage value corresponding to collector current I3 of transistor TR3. After this addition, signal voltage V0 is represented as follows:

$$V_0 = \{xi1 + (1 - x)i2\}RL \quad (14)$$
$$= x \frac{1 + j\omega CR(1 + a)}{aR(1 + j\omega CR)} RLVi + (1 - x)RLVi/RB$$
$$= \frac{aR + x(RB - aR)}{aR(1 + j\omega CR) \cdot RB} RLVi +$$
$$\frac{j\omega CR[aR + x\{(1 + a)RB - aR\}]}{aR(1 + j\omega CR) \cdot RB} RLVi$$

If RB =aR is substituted, output voltage V0 is obtained as follows:

$$V_0 = \frac{1 + j\omega CR(1 + xa)}{aR(1 + j\omega CR)} RLVi \quad (15)$$

Equation (15) is the same as equation (12) except that RL is present as a coefficient and a is replaced with xa. Therefore, as is apparent from equation (15), the frequency response characteristic of output V0 with respect to reception signal input Vi can be changed by changing the current dividing parameter x. The attenuation characteristic corresponding to tee length of the coaxial cable is thereby compensated for.

FIG. 4 shows the frequency response characteristic of a normalized impedance in equation (12) using a as a parameter. As is apparent from FIG. 4, when two or three amplifiers having the above frequency response characteristics are connected, the $\sqrt{f}$ characteristic of the coaxial cable can be approximated. As a result, attenuation caused by the $\sqrt{f}$ characteristic of the coaxial cable can be compensated for, with a high accuracy, over a wide frequency range.

Incidentally, an impedance circuit such as the CR contained in network circuit 7 can be parallel connected to emitter resistor RB of transistor TR2 shown in FIG. 2, so that second amplifier 20 (TR5, TR6) has a frequency response characteristic being similar to the curve of a small parameter "x" shown in FIG. 4.

FIG. 5 is a block diagram showing an automatic gain controlled circuit in which three amplifiers, each having a circuit configuration of FIG. 1 or 2, are connected. In this control voltage source, signal Vi transmitted through coaxial cable 1 is attenuated to a predetermined level by attenuator (ATT) 11. The amplitude frequency response characteristics of outputs VO1, VO2, and VO3 are compensated for by VCA-1 12, VCA-2 13, and VCA-3 14, and then frequency-compensated output signal Vout is delivered through output amplifier 15. A peak value of the signal output from output amplifier 15 is detected by peak detector 16, and a differential voltage between the peak detection voltage and a reference voltage of reference power source 18 is detected as control voltage Vx which is then negatively fed back to VCA-1 12, VCA-2 13, and VCA-3 14. As a result, the gains of VCA-1 12, VCA-2 13, and VCA-3 14 are variably controlled such that the amplitude of the output signal is maintained constant. (Note that circuits 16 to 18 in FIG. 5 correspond to voltage source 60 in FIG. 1.)

With the above arrangement, each of VCA-1 12, VCA-2 13, and VCA-3 14 has its own compensation frequency region and compensates for the frequency response characteristic of the reception signal in each frequency region. Therefore, as described above, compensation can be performed throughout a wide frequency range with high accuracy.

Figure 6A:
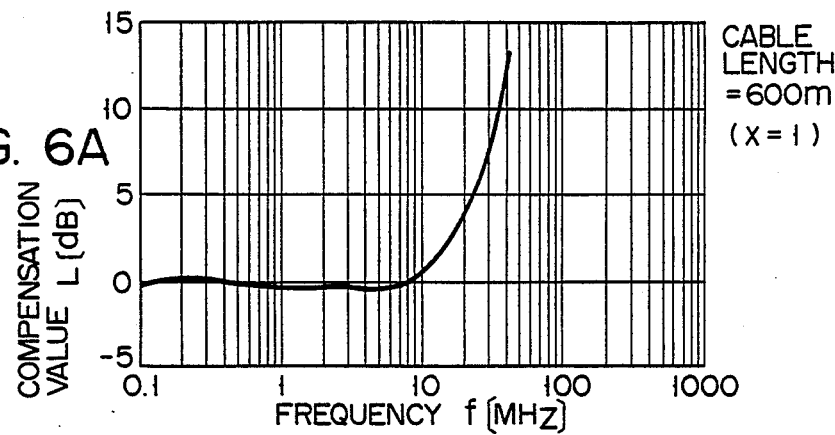
FIGS. 6A, 6B and 6C are graphs showing three types of a $\sqrt{f}$ compensation characteristic of the automatic gain-variable amplifier in FIG. 5.
Figure 6B:
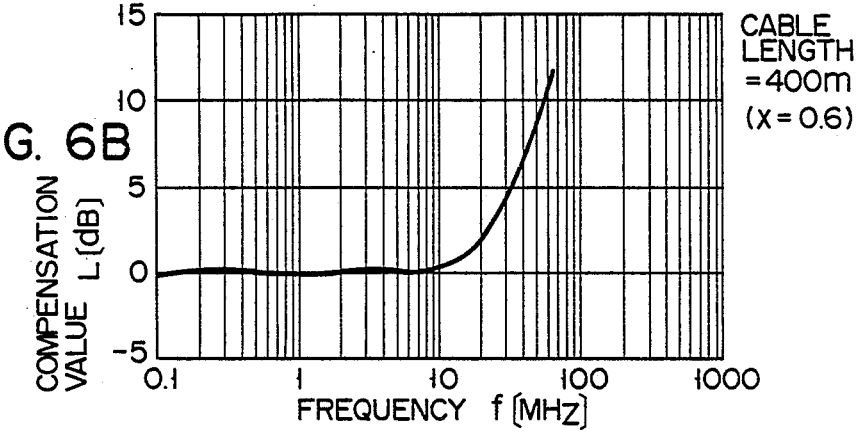
Figure 6C:
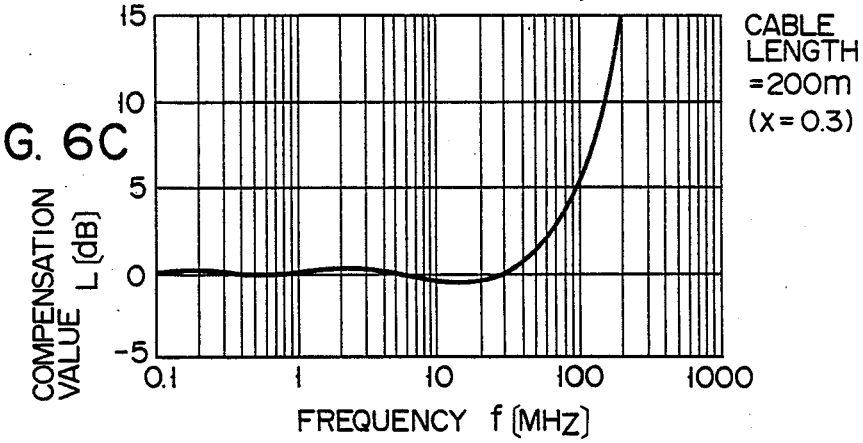

FIGS. 6A to 6C show changes in compensation attenuation amounts with respect to changes in frequencies obtained when the sample lengths of a 3C-2T coaxial cable are selected at 600 m, 400 m, and 200 m, respectively. As is apparent from the characteristics shown in FIGS. 6A to 6C, with the above automatic gain controlled circuit including the three variable gain amplifiers, the frequency response characteristic can be compensated for as high as 10 MHz, while a ripple in the response is restricted to ±1 dB.

Note that the present invention is not limited to the above arrangement. For example, in the above embodiment, the variable gain amplifier has an arrangement suitable for discrete parts. However, as shown in FIG. 7, signal input and output sections may have a differential amplifier arrangement suitable for realizing in an IC arrangement.

In addition, the network circuit may be arranged as shown in FIG. 8. In this case, impedance Z(f) of network circuit 7 is represented as follows:

$$\begin{aligned} Z(f) &= R1 + R2||(j\omega C2)^{-1} \\ &= R1 + \frac{R2}{1 + j\omega C2R2} \\ &= \frac{R1 + R2 + j\omega C2R1R2}{1 + j\omega C2R2} \\ &= (R1 + R2) \times \frac{1 + j\omega C2(R1||R2)}{1 + j\omega c2R2} \end{aligned} \quad (16)$$

When above equation (16) is compared with equation (2), the following relationship is obtained:

$$RE = aR = R1 + R2 \quad (17)$$

$$R = \frac{R1R2}{R1 + R2} \quad (18)$$

$$C = C2 \quad (19)$$

$$a = \frac{RE}{R} = \frac{(R1 + R2)^2}{R1R2} \quad (20)$$

In the above embodiment, the coaxial cable is used as the transmission path. However, the present invention can be practiced using an optical fiber. Since an optical fiber generally has a wide range frequency response for optical signals, there is no practical problem of waveform distortion of the transmitted optical signal, caused by a frequency response range limitation for the optical fiber. For this reason, in optical communications, only the attenuation characteristic of an optical fiber and the attenuation caused by a loss of an optical device need be considered. Therefore, a variable gain amplifier need not have the $\sqrt{f}$ characteristics, but can have a flat amplitude-frequency characteristic.

Figure 9:
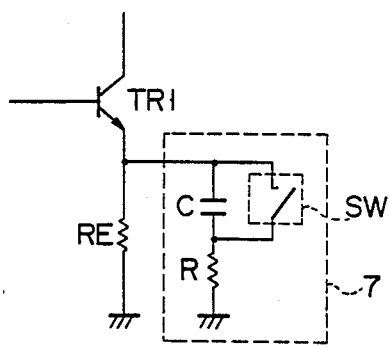
FIG. 9 is a circuit diagram showing another modification of network circuit 7 in FIG. 2 wherein its frequency response characteristic can be switched.
Figure 10:
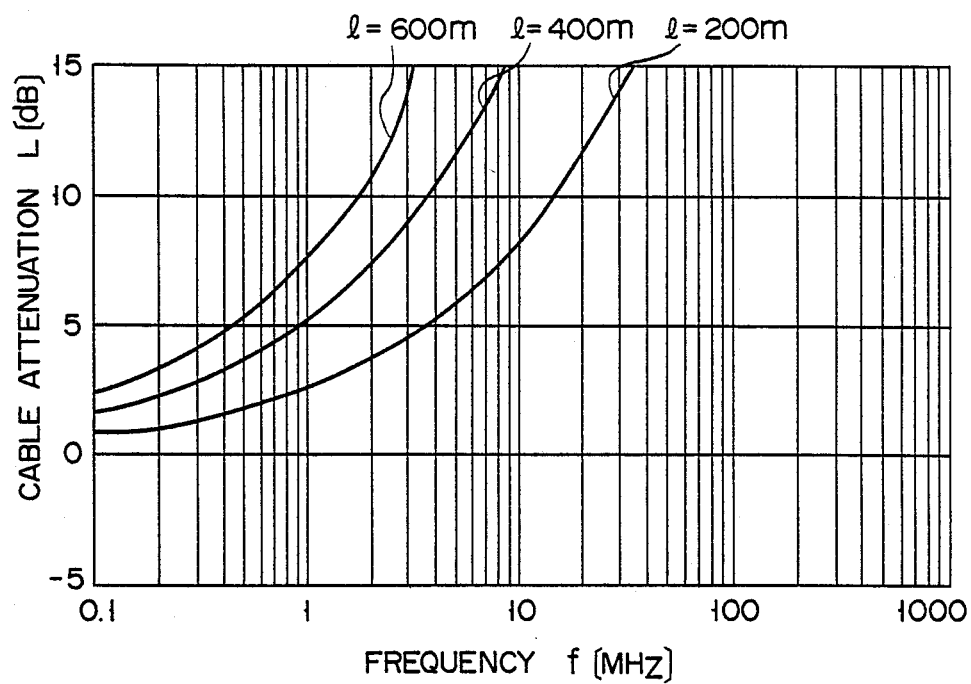
FIG. 10 is a graph showing a relationship between cable attenuation and a signal frequency using a length of a coaxial cable as a parameter.

In the circuit of FIG. 2, the $\sqrt{f}$ characteristic is obtained by network circuit 7. In the circuit of FIG. 9, however, capacitor 9 and resistor R are used as external elements connected to an IC of the automatic gain controlled circuit for optical communication. The time constant of CR in FIG. 9 may have a large enough value to move the pole of the frequency compensation characteristic to a low-frequency region, thereby substantially obtaining a flat frequency response characteristic in an actual operation range, or C may be short-circuited by switch SW to realize a flat amplitude frequency response characteristic. Note that in this case, the value of resistor R must be set to obtain a predetermined gain. For example, in order to control a gain from 0 to 20 dB, the above value is set such that the parallel resistance of emitter resistor RE and resistor R becomes about 1/10 of load resistor RL and resistor RB=load resistor RL.

With this arrangement, parameter x is adjusted in accordance with the length of an optical fiber. Thus, the gain is maximized to be 20 dB when the entire collector current of transistor TR1 flows through load resistor RL. The gain is minimized to be 0 dB when the entire current of transistor TR2 flows through load resistor RL.

FIG. 14 is a block diagram showing a second basic arrangement of a variable gain amplifier according to the present invention. In this embodiment, attenuator 30 having an attenuation ratio represented by (x/2+y/2) is arranged at the output E10 side of main amplifier 10 having, e.g., a flat frequency response characteristic. Attenuator 40a having an attenuation ratio represented by (½−x/2) is arranged, via coefficient unit 21a providing output E21a with coefficient k1, at the output E20a side of first equalizer 20a having a first high-frequency range increasing characteristic. Attenuator 40b having an attenuation ratio represented by (½−y/2) is arranged, via coefficient hunit 21b providing output E21b with coefficient k2, at the output E20b side of second equalizer 20b having a second high-frequency range increasing characteristic. Outputs E30, E40a, and E40b of the attenuators 30, 40a, and 40b are synthesized by adder 50 to be output VO.

The attenuation ratios of attenuators 30, 40a, and 40b are controlled by two types of gain control voltages Vx and Vy. For example, assuming that attenuation ratios x=1 and y=1 when Vx=1 V and Vy=1 V, respectively, the attenuation ratio of attenuator 30 becomes 0 dB, and those of attenuators 40a and 40b become −∞ dB. In this case, output VO is only E30=E10.

Assuming that attenuation ratios x=0 and y=1 when Vx=0 V and Vy=1 V, respectively, attenuation ratios of attenuators 30 and 40a become −6 dB and that of attenuator 40b becomes −∞ dB. In this case, output V0 becomes a synthetic value of E10/2 and E21a/2 (=k1E20a/2). In addition, assuming that attenuation ratios x=1 and y=0 when Vx=1 V and Vy=0 V, the attenuation ratios of attenuators 30 and 40b become −6 dB, and that of attenuator 40a becomes −∞ dB. In this case, output VO becomes a synthetic value of E10/2 and E21b/2 (=k2E20b/2). When Vx=Vy=0 V, the attenuation ratio of attenuator 30 becomes −∞ dB, those of attenuators 40a and 40b become −6 dB, and output VO becomes a synthetic value of E21a/2 and E21b/2.

In the arrangement shown in FIG. 14, by changing values of Vx and Vy between 0 to 1 V, output VO which is a synthetic value of E10, E21a, and E21b can be obtained at an arbitrary ratio. Since frequency response characteristics of equalizers 20a and 20b and coefficients k1 and k2 of coefficient units 21a and 21b can be freely set, a frequency response characteristic of output VO with respect to input Vi can be arbitrarily set in accordance with a combination of values Vx and Vy.

FIG. 15 shows a modification of FIG. 14, wherein three coefficient units 21a to 21c and three attenuators 40a to 40c are connected to three equalizers 20a to 20c, and these attenuators are controlled by three gain control voltages Vx, Vy, and Vz. In the arrangement in FIG. 15, output VO can be obtained by synthesizing outputs from amplifier 30 and coefficient units 40a to 40c at an arbitrary ratio from 0% to 33% in accordance with a combination of gain control voltages Vx, Vy, and Vz.

Figure 16:
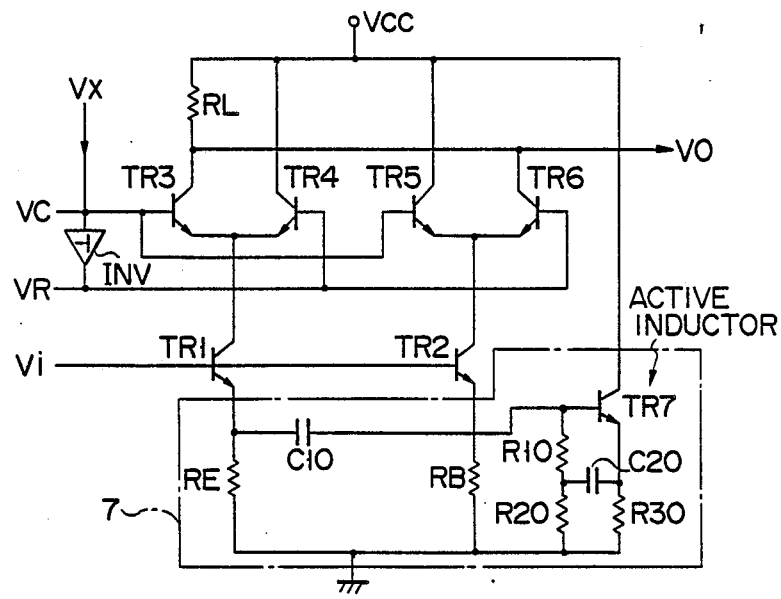
FIG. 16 is a circuit diagram showing a modification of the circuit in FIG. 2 wherein network circuit 7 is constituted by capacitor C and an active inductor using transistor TR7.

FIG. 16 shows a modification of the circuit shown in FIG. 2. In this modification, network circuit 7 includes an equivalent LC resonant circuit constituted by capacitor C and an active inductor using TR7. Resonant frequency of of the resonant circuit can be changed by C10, C20, R10, and R20, and Q of its resonance can be changed by R10 and R20. By combining the circuit of FIG. 16, in which fo and Q are suitably selected, and the circuit in FIG. 2, a desired $\sqrt{f}$ compensation characteristic can be obtained with cascade connected stages whose number being smaller than that required when the variable gain amplifier of FIG. 2 is used.

Figure 17:
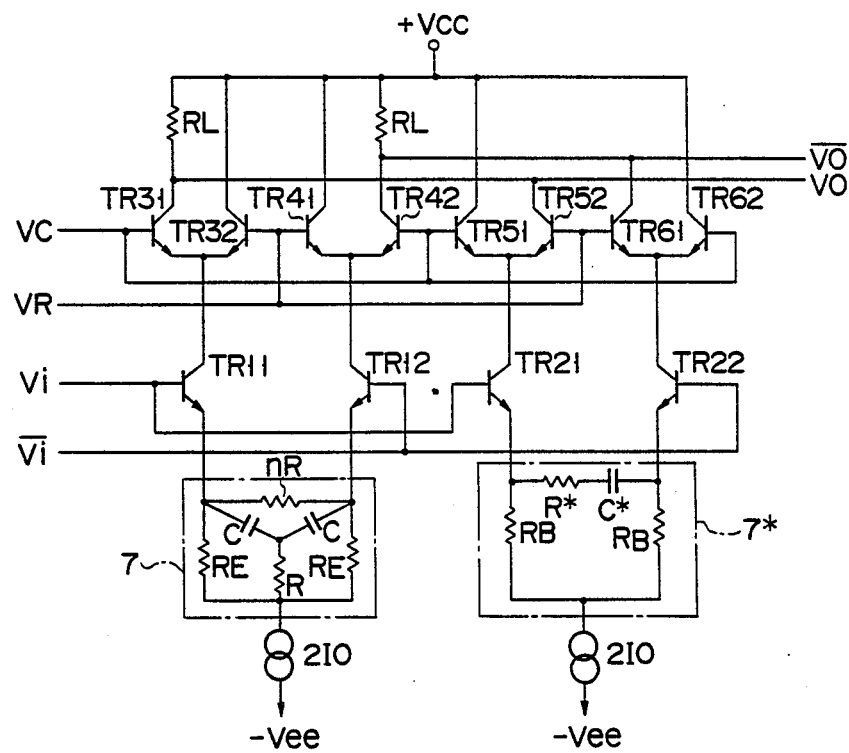
FIG. 17 is a circuit diagram showing a modification of the circuit in FIG. 7 wherein network circuits 7 and 7* are constituted by a CR bridged T circuit and a CR series circuit, respectively.

FIG. 17 shows a modification of the circuit in FIG. 7. In this modification, a bridged T circuit using a CR is utilized as network circuit 7 of a first amplifier (TR11 and TR12). When the bridged T circuit is used in this way, the frequency response characteristic, similar to that obtained when the CR series circuit in FIG. 7 is replaced with an LC series resonant circuit, can be obtained. Resonant frequency fo (minimum amplitude) appearing in the frequency response characteristic of the circuit in FIG. 17 and its Q can be changed by coefficient n of resistor nR. Note that an amplitude decrease in frequency fo of the first amplifier can be substantially cancelled by level-boosting by C*R* in network circuit 7* of a second amplifier (TR21 and TR22).

Furthermore, arrangements of the first and second amplifiers or that of the adder can be variously modified without departing from the scope of the present invention.

As has been described above in detail, according to the present invention, the first amplifier having a flat amplitude frequency response characteristic and the second amplifier having a predetermined amplitude frequency response characteristic corresponding to an attenuation characteristic of a transmission path are provided to amplify signals transmitted thereto through the transmission path. An adder is provided after the first and second amplifiers to reciprocally level-control the signals amplified by the amplifiers and to add the controlled signals to each other. An addition controller is provided to variably set an amount of level control performed by the adder in accordance with a line length of the transmission path. As a result, the variable gain amplifier can be arranged by only transistors, resistors, and capacitors without using a varactor diode. Therefore, an attenuation characteristic can be compensated for to perform waveform equalization throughout the entire line length of a transmission path, without inserting/removing a pseudo line. In addition, since an IC arrangement can be easily realized, the circuit can be made compact. Moreover, this amplifier can be applied to a plurality of types of transmission path.

What is claimed is:

1. A circuit for compensating for a frequency characteristic of a transmission signal transmitted through a transmission path having a predetermined transmission characteristic, comprising:
   first means, having a first predetermined frequency characteristic and a first predetermined amplification factor, for outputting a first signal obtained by changing an amplitude of the transmission signal with a first coefficient in accordance with a predetermined control signal;
   second means, having a second predetermined frequency characteristic and a second predetermined amplification factor, for outputting a second signal obtained by changing an amplitude of the transmission signal with a second coefficient, wherein the second predetermined frequency characteristic compensates for a characteristic depending on a length of said transmission path, and a magnitude of the second coefficient is reduced when a magnitude of the first coefficient is increased and increased when the magnitude of the first coefficient is reduced; and
   synthesizing means, coupled to said first and second means, for outputting a synthesized signal of the first signal and the second signal.

2. A circuit according to claim 1, wherein said transmission path has an attenuation frequency characteristic of attenuating the transmission signal in substantially inverse proportion to $\sqrt{f}$ where f is the frequency of the transmission signal, and the first predetermined frequency characteristic defined within a given compensation frequency range in which the attenuation frequency characteristic is to be compensated for is substantially flat.

3. A circuit according to claim 2, wherein the second predetermined frequency characteristic within the compensation frequency range has a frequency characteristic of increasing the transmission signal substantially in proportion to the $\sqrt{f}$.

4. A circuit according to claim 3, wherein said second means includes:
   means for setting a ratio between the first predetermined amplification factor, at a predetermined frequency portion of the first predetermined frequency characteristic, and the second predetermined amplification factor, at the predetermined frequency portion of the second predetermined frequency characteristic, to be a predetermined value.

5. A circuit according to claim 2, wherein said second means includes:
   switch means for selecting, as the second predetermined frequency characteristic within the compensation frequency range, from either a substantially flat frequency characteristic or a frequency characteristic of increasing the transmission signal in proportion to the $\sqrt{f}$.

6. A circuit according to claim 2, wherein the first and second coefficients are determined such that a sum of the first coefficient and the second coefficient becomes substantially a predetermined constant value.

7. A circuit according to claim 6, wherein said synthesizing means includes:
   means for adding the second signal to the first signal to provide the synthetic signal.

8. A compensating circuit for a transmission signal transmitted through a transmission path having a predetermined transmission characteristic, comprising:
   first circuit means for amplifying the transmission signal with a frequency characteristic of compensating an amplitude attenuation of the transmission signal, and outputting a first current signal;
   second circuit means for amplifying the transmission signal with a predetermined frequency characteristic and outputting a second current signal;
   load means, connected to a power source circuit, for producing an output signal corresponding to the transmission signal;
   a first transistor having an emitter for receiving the first current signal, a base for receiving a first control signal, and a collector coupled to said power source circuit via said load means;
   a second transistor having an emitter for receiving the first current signal, a base for receiving a second control signal whose level change phase is opposite to a level change phase of the first control signal, and a collector connected to said power source circuit;
   a third transistor having an emitter for receiving the second current signal, a base for receiving the first control signal, and a collector connected to said power source circuit; and a fourth transistor having an emitter for receiving the second current signal, a base for receiving the second control signal, and a collector coupled to said power source circuit via said load means.

9. A compensating circuit for a balanced transmission signal, comprising:

first balanced circuit means for amplifying the balanced transmission signal with a frequency characteristic of compensating an amplitude attenuation, and outputting a pair of first balanced current signals;

second balanced circuit means for amplifying the balanced transmission signal with a predetermined frequency characteristic, and outputting a pair of second balanced current signals;

first load means, connected to a power source circuit, for supplying a first output signal corresponding to the balanced transmission signal;

second load means, connected to said power source circuit, for supplying a second output signal having a phase opposite to that of the first output signal;

a first transistor having an emitter for receiving one of the first balanced current signals, a base for receiving a first control signal, and a collector coupled to said power source circuit via said first load means;

a second transistor having an emitter for receiving one of the first balanced current signals, a base for receiving a second control signal whose level change phase is opposite to a level change phase of the first control signal, and a collector connected to said power source circuit;

a third transistor having an emitter for receiving the other of the first balanced current signals, a base for receiving the second control signal, and a collector connected to said power source circuit;

a fourth transistor having an emitter for receiving the other of the first balanced current signals, a base for receiving the first control signal, and a collector connected to said power source circuit via said second load means;

a fifth transistor having an emitter for receiving one of the second balanced current signals, a base for receiving the first control signal, and a collector connected to said power source circuit;

a sixth transistor having an emitter for receiving one of the second balanced current signals, a base for receiving the second control signal, and a collector coupled to said power source circuit via said first load means;

a seventh transistor having an emitter for receiving the other of the second balanced current signals, a base for receiving the second control signal, and a collector coupled to said power source circuit via said second load means; and an eighth transistor having an emitter for receiving the other of the second balanced current signals, a base for receiving the first control signal, and a collector connected to said power source circuit.

10. A variable gain amplifier for compensating for an amplitude frequency response characteristic of a transmission signal transmitted through a transmission path having a predetermined attenuation characteristic, comprising:

first amplifying means, having a first predetermined frequency characteristic, for amplifying the transmission signal and outputting a first amplified signal;

second amplifying means, having a second predetermined frequency characteristic, for amplifying the transmission signal and outputting a second amplified signal, wherein the second predetermined frequency characteristic has a high-frequency range increasing characteristic of compensating for the attenuation characteristic which is changed by a length of said transmission path;

first amplitude changing means, connected to said first amplifying means, for outputting a first change signal obtained by changing an amplitude of the first amplified signal with a first coefficient in accordance with a predetermined control signal;

second amplitude changing means, connected to said second amplifying means, for outputting a second change signal obtained by changing an amplitude of the second amplified signal with a second coefficient in accordance with the predetermined control signal, wherein a magnitude of the second coefficient is reduced when a magnitude of the first coefficient is increased and increased when the magnitude of the first coefficient is reduced; and means, connected to said first and second amplitude changing means, for providing an output signal obtained by combining the first change signal with the second change signal.

11. A compensating apparatus for automatically compensating for a frequency characteristic of a trans mission signal transmitted through a transmission path having a predetermined transmission characteristic, comprising:

(a) a first compensating circuit including:

first means, having a first predetermined frequency characteristic and a first predetermined amplification factor, for outputting a first signal obtained by changing an amplitude of the transmission signal with a first coefficient in accordance with a predetermined control signal;

second means, having a second predetermined frequency characteristic and a second predetermined amplification factor, for outputting a second signal obtained by changing the amplitude of the transmission signal with a second coefficient in accordance with the predetermined control signal, wherein the second predetermined frequency characteristic has a characteristic of compensating for a characteristic depending on said transmission path, and a magnitude of the second coefficient is reduced when a magnitude of the first coefficient is increased and increased when the magnitude of the first coefficient is reduced; and first synthesizing means, connected to said first and second means, for synthesizing the first and second signals and supplying a first output signal;

(b) a second compensating circuit connected to said first compensating circuit, including:

third means, having a third predetermined frequency characteristic and a third predetermined amplification factor, for outputting a third signal obtained by changing an amplitude of the first output signal with the first coefficient in accordance with the predetermined control signal;

fourth means, having a fourth predetermined frequency characteristic and a fourth predetermined amplification factor, for outputting a fourth signal obtained by changing the amplitude of the first output signal with the second coefficient in accordance with the predetermined control signal, wherein the fourth predetermined frequency characteristic has a characteristic of compensating for the characteristic depending on said transmission path; and second synthesizing means, connected to said third and fourth means, for synthesizing the third and fourth signals and supplying a second output signal; and (c) a coefficient controller, connected to said second compensating circuit, for supplying a compensation output corresponding to the second output signal, and generating, as the predetermined control signal, a signal corresponding to a difference between a signal level of the compensation output and a predetermined reference level.

12. A variable gain amplifier for compensating for an amplitude frequency response characteristic of a signal transmitted through a transmission path having a predetermined attenuation characteristic, comprising:

a first amplifier for amplifying a signal transmitted through said transmission path and having a substantially flat amplitude frequency response characteristic, and providing a first output signal;

a second amplifier for amplifying a signal transmitted through said transmission path and having a predetermined amplitude frequency response characteristic corresponding to an attenuation characteristic of said transmission path, and providing a second output signal;

an adder circuit for reciprocally level-controlling the first and second output signals from said first and second amplifiers, so that a level of one of the first and second output signals is increased when a level of the other thereof is reduced, and adding the level controlled first and second output signals to each other; and an addition controller for variably setting an amount of the level control performed by said adder circuit in accordance with a line length of said transmission path.

13. An amplifier according to claim 12, wherein said second amplifier has as its amplitude frequency response characteristic a first characteristic obtained by approximating the attenuation characteristic of said transmission path and a second characteristic which is substantially flat, and includes means for selectively setting one of the first and second characteristics in accordance with a type of said transmission path.

* * * * *